United States Patent [19]

Felsher et al.

[11] 4,214,916
[45] Jul. 29, 1980

[54] THIN FILM PHOTOVOLTAIC CONVERTER AND METHOD OF PREPARING SAME

[76] Inventors: Hal C. Felsher, 360 Dawson La., Jericho, N.Y. 11753; Fred H. Pollak, 531 Main St., Roosevelt Island, N.Y. 10044; Arthur Bradley, 146 Beech St., Floral Park, N.Y. 11001

[21] Appl. No.: 9,645

[22] Filed: Feb. 5, 1979

[51] Int. Cl.² .................................................. H01L 31/06
[52] U.S. Cl. ............................ 136/89 SJ; 136/89 NB; 357/8; 357/15; 357/30; 250/211 J; 250/212; 427/74; 427/84; 252/62.3 Q
[58] Field of Search ........................ 136/89 NB, 89 SJ; 427/74, 84; 357/8, 15, 30; 250/211 J, 212, 211 R; 252/62.3 Q

[56] References Cited

U.S. PATENT DOCUMENTS

| | | | |
|---|---|---|---|
| 3,057,947 | 10/1962 | Calvin et al. | 136/89 |
| 3,676,688 | 7/1972 | Sharples | 250/211 R |

FOREIGN PATENT DOCUMENTS 2415399  10/1975  Fed. Rep. of Germany ............. 136/89

OTHER PUBLICATIONS

W. D. Johnston, Jr., "The Prospects for Photovoltaic Conversion," *American Scientist*, vol. 65, pp. 729-736, (1977).

"New Work Adds to Polyacetylene Potential," *Chem. & Eng. News*, Apr. 24, 1978, pp. 19-20.

*Primary Examiner*—Aaron Weisstuch
*Attorney, Agent, or Firm*—Martha G. Pugh

[57] ABSTRACT

The photovoltaic converter of the present invention comprises a thin film consisting essentially of a lattice of stacked carbon chains comprising alternating single and double bonds deposited on the surface of an electrode transparent to sunlight. The carbon lattice is prepared in situ by depositing and exposing a plastic film comprising a highly oriented polymer system to heat or other types of radiation for controlled degradation. The exposed surface of the degraded film is then covered with a vapor-deposited coating of aluminum, and is finally compressed with a metal electrode cover. Illumination directed onto the film induces an electromotive force at the interface of the degraded polymer and the transparent electrode, which constitutes a "Schottky barrier". A particular feature is the addition of the preformed polymer coating before degradation of electron-attracting molecules which serve as conductive bridges between the carbon layers in the residue.

13 Claims, 7 Drawing Figures

THIN FILM PHOTOVOLTAIC CONVERTER AND METHOD OF PREPARING SAME

BACKGROUND OF THE INVENTION

This invention relates in general to photovoltaic devices; and their preparation, and more particularly, to combinations including thin film organic polymer semiconductors which, in conjunctions with appropriate electrodes, function to convert light into electricity.

It is well known that a part of the energy of sunlight can be captured and converted directly to electricity by photovoltaic devices otherwise known as solar cells. These devices are generally fabricated from inorganic materials such as silicon, gallium arsenide, cadmium sulfide, etc. The mechanism for this type of solar energy conversion, known as the photovoltaic effect, has been described in the literature of solid state physics (W. D. Johnston, Jr. *American Scientist*, Nov/Dec 1977, p. 729). In certain types of materials, known as semiconductors, a photon which is an elementary unit of light energy, may transfer part of its energy to raise a negative charge carrier (electron) from a filled state (valence band) to an empty state (conduction band) leaving behind the absence of an electron which behaves like a positive charge carrier (hole). Solar cells have an internal (solid state) characteristic which promotes the separation of such photogenerated carriers (electrons and holes); and the resultant potential gradient initiates a flow of electricity in an attached external circuit. In practical prior art situations it has been possible to convert as much as 20% of the energy of the sunlight at air mass zero into electrical energy for either immediate use or storage.

Although the materials used in some solar cells are plentiful on the earth's crust, they are expensive to isolate in a form pure enough and of such quality as to be free of impurities and/or defects. Silicon, for example, must be freed of impurities down to the parts-per-billion level and then, for some applications, carefully grown into single crystals. The material must be fabricated to have a p-n junction or Schottky barrier which promotes the separation of the photogenerated carriers. The foregoing processes are expensive and not easily adaptable to mass production.

According to well-known solid state theory, the voltage which can be developed by a solar cell is a function of the excess of minority carriers on either side of the potential gradient junction. Minority carriers take the form of holes in n-type material and electrons in p-type material. The voltage so developed is less than the band gap (minimum energy required to create an electron-hole pair because of junction losses. For example, solar cells fabricated from silicon (band gap=1.1 electron volts) typically have an open-circuited voltage of about 0.5 volts. Similar magnitudes of open-circuit voltages have been measured for organic semiconductor photocells (A. K. Ghosh and T. J. Teng, J. Appl. Phys., Volume 44, 2781, (1973); Volume 45, 230, (1974).

There are various loss processes which reduce the efficiency of conversion of sunlight to electricity. Out of the spectrum of photon energies which comprise sunlight, only those with energy greater than the band gap (for example, 1.1 electron volts for silicon) can be absorbed to produce photocharges. This amounts to 77% of the incoming solar light in the case of silicon. Part of the light is reflected off the surface of the crystal because of the differing refractive indices of the material. For example, the refractive index:

$n_s$ (for silicon) = 3.4; and
$n_a$ (for air) = 1 Then, reflectivity:

$$R = \frac{(n_s - n_a)^2}{(n_s + n_a)^2} = \frac{(3.4 - 1)^2}{(3.4 + 1)^2} \approx 3/10 \quad (1)$$

Thus, approximately 30% of the photons in sunlight are of the proper energy, are not reflected, and can enter the crystal to be absorbed.

(2) The fraction absorbed in the crystal:
$F_A = 1 - e^{-\alpha t}$
Where $\alpha$ = the absorption constant;
$t$ = the thickness of the crystal, and
$e^{-\alpha t}$ = the fraction of light transmitted through the photovoltaic cell.

The optimal depth of the p-n junction region beneath the face of the crystal is dictated by such factors as where in the crystal most of the light is absorbed so as to produce electron and hole pairs, the lifetimes and mobilities of the photocarriers, and the resistance of the very thin side of the junction next to the surface through which the current must flow to reach the front contact electrode. This latter resistance is governed predominantly by the geometry of the photovoltaic cell, while the other phenomena are functions of the material characteristics of the crystal itself. In general, high quality, low resistivity material is needed to enhance the lifetime of the photocarriers, prevent their recombination (a loss process), and allow them to diffuse further. This increases their chances of encountering the electric field at the junction, being separated, and producing a current.

In the prior art, the principal difficulty with the efficient conversion of light energy into electrical energy by organic materials has been their high resistivity. Organic materials have no scarcity of carriers; but in general, they are feeble conductors of electricity even under bright illumination.

SHORT DESCRIPTION OF THE INVENTION

It is therefore a general object of this invention to provide an improved photovoltaic converter and methods for preparing the same.

A more particular object is to adapt the techniques of organic polymer chemistry to photovoltaic conversion.

A further object of the invention is to provide a photovoltaic device comprising an inexpensive opaque thin organic film which is formed in situ in intimate contact with an electrode surface to form a potential gradient junction at the interface thereof.

These and other objects are achieved in accordance with the present invention in a photovoltaic converter comprising a thin film not exceeding about 20 microns in thickness, consisting essentially of a lattice or skeleton of stacked carbon chains with alternating single and double bonds prepared by controlled degradation from a highly oriented polymer system which is deposited in intimate contact with an electrode essentially formed from a material substantially transparent to sunlight. It is within the contemplation of the present invention that the skeleton of stacked carbon chains is formed by conversion in situ from a pre-formed polymer coating of optimum dimensions by chemical, thermal or radiation degradation treatment. One suitable example of an organic material useful for the purposed of the present invention, is polyvinyl chloride, which darkens under exposure to ultraviolet light to form a superconjugated carbon chain. Another example is a film of polyvinyl acetate deposited on a glass plate by evaporation of a solution, which film is decomposed by heat, and subsequent removal of the volatiles, such as acetic acid, by evacuation, leaving intact a charred residue intimately in contact with the glass substrate. The exposed surface of the latter is covered with a vapor-deposited coating of aluminum which serves as an electrode and is finally compressed with an electrode cover which may be any metal of suitable conductivity. In either of the above examples, illumination directed onto the film creates an electromotive force at the interface of the degraded polymer and transparent electrode, which constitutes what is known in the art as a "Schottky barrier".

A particular feature of the present invention is an additive of electron-attracting molecules by incorporation into the preformed polymer coating before it is reduced by controlled degradation to an electron-rich carbon skeleton or aromatic matrix. Examples of materials which function as electron-attracting molecules for the purposes of the present invention are phthalocyanine, chloranil and tetracyanoethylene, the latter, being a relatively stable compound when combined with a polyvinyl chloride coating, will survive ultraviolet degradation of the coating intact.

Another alternative is the synthesis of the additive in situ, as well as the principal carbon backbone. For example, a mixture comprising a thin layer of a vinyl polymer, cupric chloride and O-phthalonitrile is heated in vacuo to between 350° and 400° Centigrade until polyacetylene and copper phthalocyanine are formed. The melt is slow-cooled or annealed in order to give the most thermodynamically stable molecular complex time to form a crystalline array.

It is contemplated that a solar converter in accordance with the present invention comprising a thin black uniformly-structured conjugated carbon film, particularly one containing inter-planar additives of impurity atoms which serve as conductive bridges, has a potential for efficient solar energy conversion comparable to a silicon wafer. Solar cells formed in accordance with the present invention would be simple and inexpensive to fabricate and would tend to make photovoltaic energy-generating arrays more economically competitive with conventional types of system in which energy is generated by the burning of fossil fuels.

These and other objects, features and advantages of the invention will be better understood from a study of the detailed description hereinafter with reference to the attached drawings.

SHORT DESCRIPTION OF THE DRAWINGS

Figure 5:
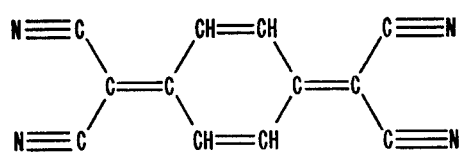
Figure 6:
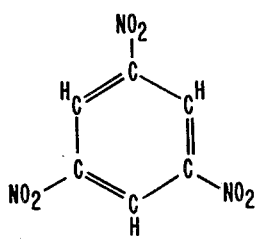
Figure 7:
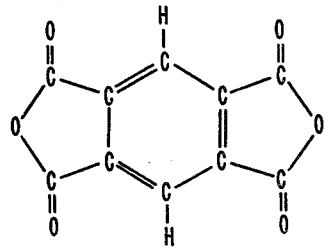

FIGS. 5, 6 and 7 respectively show structural diagrams for the following electron attractive additives: tetracyanoquinodimethane, 1,3,5-trinitrobenzene and pyromellitic anhydride.

DETAILED DESCRIPTION OF THE INVENTION

Figure 1:
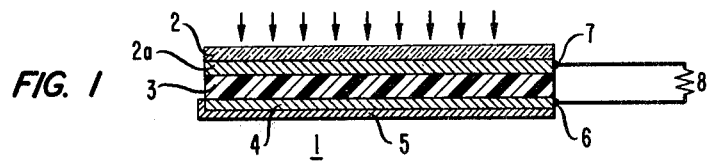
FIG. 1 is a schematic showing of a photovoltaic cell of the present invention, the thickness of the polymer film and electrode coatings being greatly exaggerated for the purpose of illustration.

Referring to FIG. 1 of the drawings, there is shown in schematic, a typical photovoltaic cell in accordance with the present invention.

This includes a conductively-coated glass substrate 2, which may comprise for example, a sheet of glass, 2 millimeters thick, 10 centimeters wide and 20 centimeters long, covered with a layer $2a$, say, 0.1 micron thick, of stannous chloride serving as one electrode, and connected by a metal tab to the external circuits.

Deposited in intimate contact with the conductive coating surface of the glass substrate 2, by one of the techniques to be described in detail hereinafter, is a film 3 comprising a lattice of conjugated carbon atoms, which in the present example may be $10^5$ Angstroms thick, the film in the present example having a length and width of 10 centimeters by 20 centimeters on the principal plane of the substrate.

The exposed surface of the film 3, to be presently described, is covered by a conventional vacuum-deposition process with a layer 4, say, 0.1 micron thick, of a metal, which is preferably aluminum, although it is contemplated that other metals can be used for this purpose. The composite, including the coated glass substrate 2, electrode $2a$, the conjugated carbon lattice layer 3, and the evaporated electrode coating 4 are compressed with a metal electrode cover 5, which may be formed, for example, from a plate of steel 2 millimeters thick which is long and wide enough to cover the entire surface of the electrode 4. To complete the circuit between the photovoltaic cell 1 and the load 8 are a pair of contacts 6 and 7 which are respectively applied to each of the electrodes $2a$ and 4. Thus the voltage generated in the cell 1 when light falls on the transparent electrode $2a$ in the direction shown by the arrows, is placed across the load 8.

Specific techniques for forming the conjugated carbon lattice coating, which is a specific feature of the present invention, will now be described in detail.

As set forth in the introduction, one of the principal functions of the present invention is to provide an opaque thin organic film which is deposited or otherwise formed in intimate contact with an electrode so as to form a potential gradient junction at the interface, which operates efficiently to convert photons of the proper energy into electricity. An important characteristic of the thin film material for the purposes of the present invention is to provide a material of relatively low resistivity to enhance the lifetime of the photocarriers created at the junction by the incident sunlight, preventing their recombination. This increases their chances of remaining separated, migrating to the electrodes and producing a current.

Photoconduction in thin organic polymer films was described in 1963 (Journal of the Electrochemical Society, Volume 110, June, p. 543); but the best were some six orders of magnitude too low for consideration as useful photon energy conversion devices. It lies within the province of the present invention that the types of polymer films investigated at that time (deposited from vapor by gas discharge techniques) are transformed to a conjugated carbon skeleton by chemical, thermal or radiation treatment, as in the examples to follow.

Figure 2:
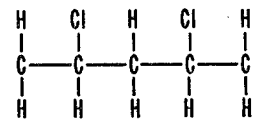
FIG. 2 shows the structural formula of polyvinyl chloride.

In accordance with the present invention, a preformed polymer coating of optimum dimensions which in the present example may be 20 centimeters long, 10 centimeters wide and 10−3 centimeters (10 microns) thick, is converted by controlled degradation to a linear (polyacetylene) or two-dimensional (graphite) structure. One example of an optimum film for the purposes of the present invention is a colorless polyvinyl chloride, the structural formula for which is shown in FIG. 2. When exposed to ultraviolet light, say, of the order of 100 watts striking the surface, for a period of, say, 60 minutes or more, the polyvinyl chloride film is degraded to a super-conjugated chain of carbon atoms having alternate single and double bonds, forming a structure represented schematically in FIG. 3 of the drawings.

Another example of in situ formation of a photoconductive electrode is as follows: A solution of polyvinyl acetate in methylethylketone, in which the solvent evaporates from a conductive glass plate, leaves a film deposit of polyvinyl acetate. This is decomposed say, by heating it up to about 200° Centigrade, for a period of 30 minutes, or more with subsequent removal of volatiles (such as acetic acid) by evacuation. The charred residue remains intact and still intimately in contact with the glass electrode.

Figure 3:
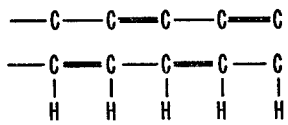
FIG. 3 shows the structural formula of the superconjugated carbon chain which results when polyvinyl chloride is exposed to ultra violet light.

As shown in FIG. 1, the exposed surface of the degraded film of the type shown in FIG. 3 is then covered with an aluminum layer 4 by conventional evaporation techniques and is finally compressed with a metal electrode cover 5. The organic layer is a conductive carbon framework of the type shown in FIG. 4, which is a schematic representation of graphite, or that shown in FIG. 3, or somewhere in between.

With illumination on the cell 1, as shown in FIG. 1, an electromotive force is created at the interface of the degraded polymer and the transparent electrode 2a, which constitutes the "Schottky barrier".

Figure 4:
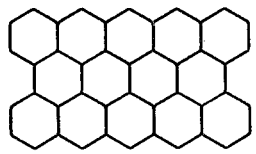
FIG. 4 shows the typical conductive carbon framework which is characteristic of graphite; and which also represents the optimum end product when an evaporated film, such as polyvinyl acetate, is decomposed in accordance with the present invention.

Graphite, shown structurally in FIG. 4, is an end-product of a naturally occuring non-oxidative thermal decomposition of organic matter. It has good electrical conductivity in two dimensions because of its structure in layers of flat plates, each of which forms a separate condensed aromatic system. It is believed that such conjugated (alternating single and double bond) atomic linkages offer no resistance to charge transfer—an essentially infinite electrical conductivity on the molecular scale. Graphite cannot be handled as a thin film because the planes slide across each other and charge carriers cannot negotiate the gap between planes. Previous attempts to create synthetic graphite films by careful pyrolysis of organic polymeric coatings on or between electrodes have failed because of contamination with free carbon granules or other irregularities or "traps".

As disclosed in the prior art, the conductivity of graphite has been improved by the incorporation of impurity atoms between the condensed aromatic planes (F. L. Vogel, American Physical Society, Atlanta, Georgia, March, 1976). It has been theorized that the interplanar additives serve as conductive bridges for charge carriers and, further, that they spontaneously induce a charge separation that creates a local environment favorable to promotion of carriers to a free or conduction band level. It has been further disclosed in the prior art that molecular complexes have enhanced conductivity in both inorganic and organic systems; and that iodine added to phthalocyanine pellets lowered their resistance by a factor of about 10 (*Chemical & Engineering News*, July 4, 1977, p. 15). An "organic metal" cited in the recent prior art for high current fow at low temperature is the molecular complex of tetracyanoethylene and tetrathiofulvene (Accounts of Chemical Research, Volume 7, 1974, P. 232).

It is a feature of the present invention that a theoretically optimum addition of electron-attracting molecules such as phthalocyanine, tetracyanoethylene, and chloranil, can be incorporated into the shaped polymer structure before it is reduced by controlled degradation to an electron-rich conjugated carbon skeleton or aromatic matrix of the type shown in FIG. 3.

It should be noted that as set forth in the prior art, these electron-rich organic structures are prepared under conditions considerably less rigorous than those reported for pyrolytic graphites or the thermal degradation of polyacetonitrile to a semiconductive char (F. Gutman and L. E. Lyons, *Organic Semiconductors*, Wiley, New York, 1967). A stable electron-withdrawing additive such as tetracyanoethylene will survive ultraviolet degradation of polyvinyl chloride essentially intact. Another attractive technique in accordance with the present invention is the synthesis of the additive in situ as well as the principal carbon backbone. Thus, a thin layer mixture of about up to 10 microns vinyl polymer, cupric chloride, and o-phthalonitrile is heated in vacuo to 350–400° Centrigrade until polyacetylene and copper phthalocyanine are formed. Slow cooling or annealing of the melt at a rate of, say 50° Centigrade per hour, will give the thermodynamically most stable molecular complex time to form a crystalline array.

Strictly speaking, a molecular complex suitable for the purposes of the present invention approaches the characteristics of an "organic metal" rather than a semiconductor. The photovoltaic device of the present invention described herein, need have semiconductor properties only in the immediate vicinity of the potential gradient "Schottky barrier", to within approximately 500 A° of the interface with the transparent electrode 2a. Elsewhere, the requirement is high current density, stability toward the conditions of manufacture and use, and a good ohmic contact to the external electrical circuit.

In accordance with the prior art, a common way of enhancing the conductivity of an organic polymer is to incorporate fine wires of highly conducting metal, such as silver, copper, or aluminum or metal powder or carbon black. In every such case the additive is massive compared to the atomic dimensions, and there is no possibility of truly uniform distribution. All current is carried by the added metal, with the host plastic providing bulk properties only. At the micron thickness level, such a metal-doped film cannot sustain a voltage drop—it behaves like a collection of pinholes held together by an organic binder.

The organic metal concept of the prior art, utilizing charge transfer complexes strives toward a new composition of matter. Its unsaturated carbon chains and rings are electronically "alive"—acting as a source of carriers and offering no obstacle to their movement in an electric field. The electron-accepting additive molecules function as conductive bridges causing the entire film to behave as one great conjugated molecule. However, there are specific requirements to be met, as follows:

(a) a dense homogenous oriented structure, in the "crystalline" polymer sense, with all electrodonating chains parallel and close packed;

(b) electron-acceptor additives flat and parallel, symmetrically substituted to present a uniform face, to the pi-bond (conjugated carbon atom) system, avoiding internal field distortion;

(c) interplanar spacing less than van der Waals bonding distances apart, yet free of significant similar charge repulsive interactions.

Ideally, the unpaired electrons contributed by the pi-bond conjugated carbon atom system should delocalize into a metal-like conduction band. The base materials, polyvinyl chloride and polyvinyl acetate, are excellent insulators ($10^{20}$ ohm-cm resistivity); but each polymer starts with the essential physical requirement of a high degree of internal alignment. Actually no organic substance is crystalline enough to simulate the ordered structure of the metallic state; but in organic substances most suitable for the purposes of the present invention, the most uniform pattern of close-packed charge transfer complexes will result in the best pseudo-metallic conduction behavior after controlled degradation.

In addition to previously mentioned phthalocyanine and its metal salts, tetracyanoethylene, and chloranil, some proposed electron-attractive additives are:

tetracyanoquinodimethane, having a structural diagram as shown in FIG. 5, or 1, 3, 5-trinitrobenzene, having a structural diagram as shown in FIG. 6; or pyromellitic anhydride having a structural diagram as shown in FIG. 7.

Referring again to the photocell device shown in FIG. 1, the voltage available across the electrode terminals 6 and 7 approaches the band gap, when intense illumination is applied in the direction of the arrows. Similarly, internal resistance is minimized by sustaining a high level of photoexcited bulk carriers in the conjugated carbon film 3. It is clear that the device must have long-term stability under constant high rate of photon flux.

The requirements of an efficient photovoltaic device of the type shown in FIG. 1 may be summarized as follows:

(a) a band gap, or forbidden zone must exist between the bound (valence) and free (excited) states of charge carriers in the film 3. The value of this band gap should be greater than 1 electron volt and less than 2 electron volts;

(b) film 3 must be characterized by a high absorption coefficient for photons, of energy just exceeding the band gap;

(c) the device must have an interface between the substate 2 and film 3 which carriers cross spontaneously in a favored direction; and (d) film 3 must have material characteristics which enhance the lifetimes of the photo-carriers, prevent their recombination and allow them to diffuse toward the potential barrier junction between substrate 2 and film 3.

It is contemplated in accordance with the present invention that a thin black uniformly-structured conjugated carbon film, formed in the manner described hereinbefore, has potential for efficient light energy conversion comparable to a silicon wafer.

The main thrust of this invention is to maximize photoconductivity, since condition (d) above is the most difficult one to fulfill. Secondly, the present invention promotes the semiconductive properties of carbon, formed by the controlled degradation of common polymers, for the economical advantage which will make solar energy conversion a practical reality.

It will be understood that the invention is not to be construed as restricted to the particular structures or materials shown herein by way of illustration, but only by the scope of the appended claims.

What is claimed is:

1. A photovoltaic device comprising in combination:

an electrode comprising a substrate essentially transparent to light;

a thin film in intimate contact with said electrode substrate consisting essentially of a lattice of stacked carbon chains having alternating single and double bonds containing between zero and one hydrogen atom per carbon, degraded from a highly oriented organic polymer, the interface between said film and said electrode substrate constructed to act as a source of photo-induced voltage;

wherein said lattice of stacked carbon atoms consists essentially of a conjugated carbon or carbon-hydrogen structure, plus an electron-attracting additive which causes an internal separation of the charges on said stacked carbon atoms by attracting electrons from the pi-bonds of said conjugated carbon structure; and wherein said electron-attracting additive consists essentially of phthalocyanine or one of its metal salts.

2. A photovoltaic device comprising in combination;

an electrode comprising a substrate essentially transparent to light;

a thin film in intimate contact with said electrode substrate consisting essentially of a lattice of stacked carbon chains having alternating single and double bonds containing between zero and one hydrogen atom per carbon, degraded from a highly oriented organic polymer, the interface between said film and said electrode substrate constructed to act as a source of photo-induced voltage;

wherein said lattice of stacked carbon atoms consists essentially of a conjugated carbon or carbon-hydrogen structure, plus an electron-attracting additive which causes an internal separation of the charges on said stacked carbon atoms by attracting electrons from the pi-bonds of said conjugated carbon structure; and wherein said electron-attracting additive is essentially tetracyanoethylene.

3. The combination comprising a substrate of solid electrically-conducting material transparent to light;

a thin film in intimate contact with said electrode substrate consisting essentially of a lattice of stacked carbon chains having alternating single and double bonds containing between zero and one hydrogen atom per carbon, degraded from a highly oriented organic polymer, the interface between said film and said electrode-substrate constructed to act as a source of photo-induced voltage;

wherein said lattice of stacked carbon atoms consists essentially of a conjugated carbon or carbon-hydrogen structure, plus an electron-attracting additive which causes an internal separation of the charges on said stacked carbon atoms by attracting electrons from the pi-bonds of said conjugated carbon structure; and wherein said electron-attracting additive is essentially phthalocyanine or one of its metal salts.

4. The combination comprising a substrate of solid electrically-conducting material transparent to light;

a thin film in intimate contact with said electrode substrate consisting essentially of a lattice of stacked carbon chains having alternating single and double bonds containing between zero and one hydrogen atom per carbon, degraded from a highly oriented organic polymer, the interface between said film and said electrode-substrate constructed to act as a source of photo-induced voltage;

wherein said lattice of stacked carbon atoms consists essentially of a conjugated carbon or carbon-hydrogen structure, plus an electron-attracting additive which causes an internal separation of the charges on said stacked carbon atoms by attracting electrons from the pi-bonds of said conjugated carbon structure; and wherein said electron-attracting additive is essentially tetracyanoethylene.

5. The method of fabricating a photovoltaic device which comprises the steps of:

depositing a film of highly oriented organic polymer on a transparent electrically-conducting substrate;

subjecting said film in situ to controlled degradation by chemical, thermal or radiation treatment to form a condensed aromatic or otherwise highly conjugated carbon macromolecule system with a high population of mobile pi-electrons;

wherein the step of subjecting said film in situ to controlled degradation is carried out in the presence of an electron-attracting compound, to form chains of indefinite length by charge transfer complexes with the condensed aromatic or highly conjugated carbon macromolecule system; and wherein said electron-attracting compound is a metallic salt of phthalocyanine formed in situ by thermal reaction of an inorganic salt and a nitrogen-containing derivative.

6. The method in accordance with claim 5 wherein said inorganic salt is cupric chloride, and said nitrogen-containing derivative of phthalic acid is o-phthalonitrile.

7. The method in accordance with claim 5 in which said controlled degradation is carried out by heating said film-substrate composite up to a temperature within the range 100 and 300 degrees Centigrade.

8. The method in accordance with claim 7 in which said film consists essentially of a copolymer of polyvinyl chloride and polyvinyl acetate.

9. The method in accordance with claim 5 in which said controlled degradation is carried out by depositing a solution of said highly oriented organic polymer on said substrate, and evaporating the solvent from said solution to leave the solute film deposited in intimate contact with said substrate; and wherein said solute film is further decomposed by heating it up to a temperature within the range 100 to 300 degrees Centigrade.

10. The method in accordance with claim 9 wherein said solution consists essentially of polyvinyl acetate in a solvent which is evaporated to leave a film of polyvinyl acetate on said substrate.

11. The method in accordance with claim 5 in which said controlled degradation is carried out by irradiating said film with ultra violet light having an intensity within the range of about 10 to 1000 watts.

12. The method in accordance with claim 11 wherein said film consists essentially of polyvinyl chloride.

13. The product by the process of claim 5.

* * * * *

UNITED STATES PATENT AND TRADEMARK OFFICE
CERTIFICATE OF CORRECTION

PATENT NO. : 4,214,916

DATED : July 29, 1980

INVENTOR(S) : Felsher et al.

It is certified that error appears in the above-identified patent and that said Letters Patent are hereby corrected as shown below:

Column 3, line 31, change "O-phthalonitrile" to ---o-phthalontrile---. Column 5, line 6, change "10-3" to ---$10^{-3}$---.

Signed and Sealed this

Twenty-eighth Day of October 1980

[SEAL]

Attest:

SIDNEY A. DIAMOND

Attesting Officer

Commissioner of Patents and Trademarks